(12) United States Patent
Ko

(10) Patent No.: US 9,825,613 B1
(45) Date of Patent: Nov. 21, 2017

(54) RESISTOR CALIBRATION SYSTEM

(71) Applicant: NOVATEK Microelectronics Corp., Hsin-Chu (TW)

(72) Inventor: Po-Yao Ko, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 15/585,174

(22) Filed: May 3, 2017

(51) Int. Cl.
  *H03K 19/00* (2006.01)
  *H03H 11/30* (2006.01)
  *H03K 17/00* (2006.01)
  *H03K 5/24* (2006.01)

(52) U.S. Cl.
  CPC ............ *H03H 11/30* (2013.01); *H03K 5/24* (2013.01); *H03K 17/005* (2013.01); *H03K 17/007* (2013.01)

(58) Field of Classification Search
  CPC ...... H03K 5/24; H03K 17/007; H03K 17/005; H03H 11/30
  USPC .......................................................... 326/30
  See application file for complete search history.

(56) References Cited

U.S. PATENT DOCUMENTS

| | | | | |
|---|---|---|---|---|
| 2011/0066798 A1* | 3/2011 | Kaiwa | ...................... | G11C 7/04 711/106 |
| 2012/0099383 A1* | 4/2012 | Kim | ...................... | G11C 7/1057 365/189.02 |
| 2015/0235679 A1* | 8/2015 | Arai | ...................... | G11C 7/1057 365/230.08 |
| 2015/0235680 A1* | 8/2015 | Takeda | .................. | G11C 7/1057 365/189.05 |
| 2016/0071568 A1* | 3/2016 | Sakai | ................... | G11C 11/1675 365/158 |
| 2016/0118984 A1* | 4/2016 | Chern | ................. | H03K 19/0005 365/189.02 |
| 2016/0182044 A1* | 6/2016 | Addepalli | ............... | G11C 16/06 326/30 |

* cited by examiner

*Primary Examiner* — Don Le
(74) *Attorney, Agent, or Firm* — Winston Hsu

(57) ABSTRACT

A resistor calibration system includes a reference resistor, a first control circuit, a second control circuit, a comparator, a multiplexer and a de-multiplexer. The first control circuit calibrates a first resistor and a duplicated first resistor. The second control circuit calibrates a second resistor. The comparator includes a first input terminal receiving a reference voltage, a second input terminal and an output terminal. The multiplexer includes a first input terminal coupled to the reference resistor and the first resistor, a second input terminal coupled to the duplicated first resistor and the second resistor, and an output terminal coupled to the second input terminal of the comparator. The de-multiplexer includes an input terminal coupled to the output terminal of the comparator, a first output terminal coupled to the first control circuit, and a second output terminal coupled to the second control circuit.

10 Claims, 5 Drawing Sheets

RESISTOR CALIBRATION SYSTEM

BACKGROUND OF THE INVENTION

1. Field of the Invention

The present invention relates to a resistor calibration system, and more particularly, to a resistor calibration system capable of calibrating an on-chip termination resistor.

2. Description of the Prior Art

On-chip termination (OCT) is the technology where the termination resistor for impedance matching in transmission lines is located inside a semiconductor chip instead of on a printed circuit board (PCB). In order for a transmission line to minimize distortion of the signal, the impedance of every location on the transmission line should be uniform throughout its length. If there is any place in the line where the impedance is not uniform for some reason (e.g., open circuit, impedance discontinuity, different materials), the signal gets modified by reflection at the impedance change point which results in distortion, ringing and so forth. In order to avoid impedance mismatch, termination impedance with the equivalent amount of impedance should be placed at the end point of the transmission line. This is described as "termination". There are several ways of termination depending on how the resistors are connected to the transmission line. Parallel termination and series termination are examples of termination methodologies.

Instead of having the necessary resistive termination located on the motherboard, the termination located inside the semiconductor chips is called OCT. In order to achieve better signal integrity and higher operational speed of data buses, the accurate OCT values are necessary. The conventional OCT calibration implementation is accomplished with an external reference resistor, which is connected to the chip via a pad. The external reference resistor has an accurate resistance value. This reference resistor is connected to a target resistor in the chip via the pad, to adjust the resistance value of the target resistor by monitoring a voltage on the pad, where the voltage is obtained by voltage division of the resistance values of the external reference resistor and the target resistor. The voltage obtained by the voltage division may further be compared with a reference voltage via a comparator, in order to control the calibration of the target resistor.

However, the comparator may usually possess an offset error between its two input terminals. For example, the output of an ideal comparator may change state when the voltages on the two input terminals of the comparator become equal. When an input offset error occurs in the comparator, the output of the comparator may change state when the voltage on an input terminal is slightly higher or lower than the voltage on another input terminal. This results in an error of the OCT calibration. Thus, there is a need for improvement over the prior art.

SUMMARY OF THE INVENTION

It is therefore an objective of the present invention to provide a resistor calibration system, which is capable of calibrating an on-chip termination resistor while eliminating the input offset error of the comparator, in order to achieve more accurate resistance calibration.

The present invention discloses a resistor calibration system, which comprises a reference resistor, a first control circuit, a second control circuit, a comparator, a multiplexer and a de-multiplexer. The reference resistor is used for providing a reference resistance. The first control circuit is used for calibrating a first resistor and a duplicated first resistor. The second control circuit is used for calibrating a second resistor. The comparator comprises a first input terminal, a second input terminal and an output terminal, wherein the first input terminal of the comparator receives a reference voltage. The multiplexer comprises a first input terminal, a second input terminal and an output terminal, wherein the first input terminal of the multiplexer is coupled to the reference resistor and the first resistor, the second input terminal of the multiplexer is coupled to the duplicated first resistor and the second resistor, and the output terminal of the multiplexer is coupled to the second input terminal of the comparator. The de-multiplexer comprises an input terminal, a first output terminal and a second output terminal, wherein the input terminal of the de-multiplexer is coupled to the output terminal of the comparator, the first output terminal of the de-multiplexer is coupled to the first control circuit, and the second output terminal of the de-multiplexer is coupled to the second control circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
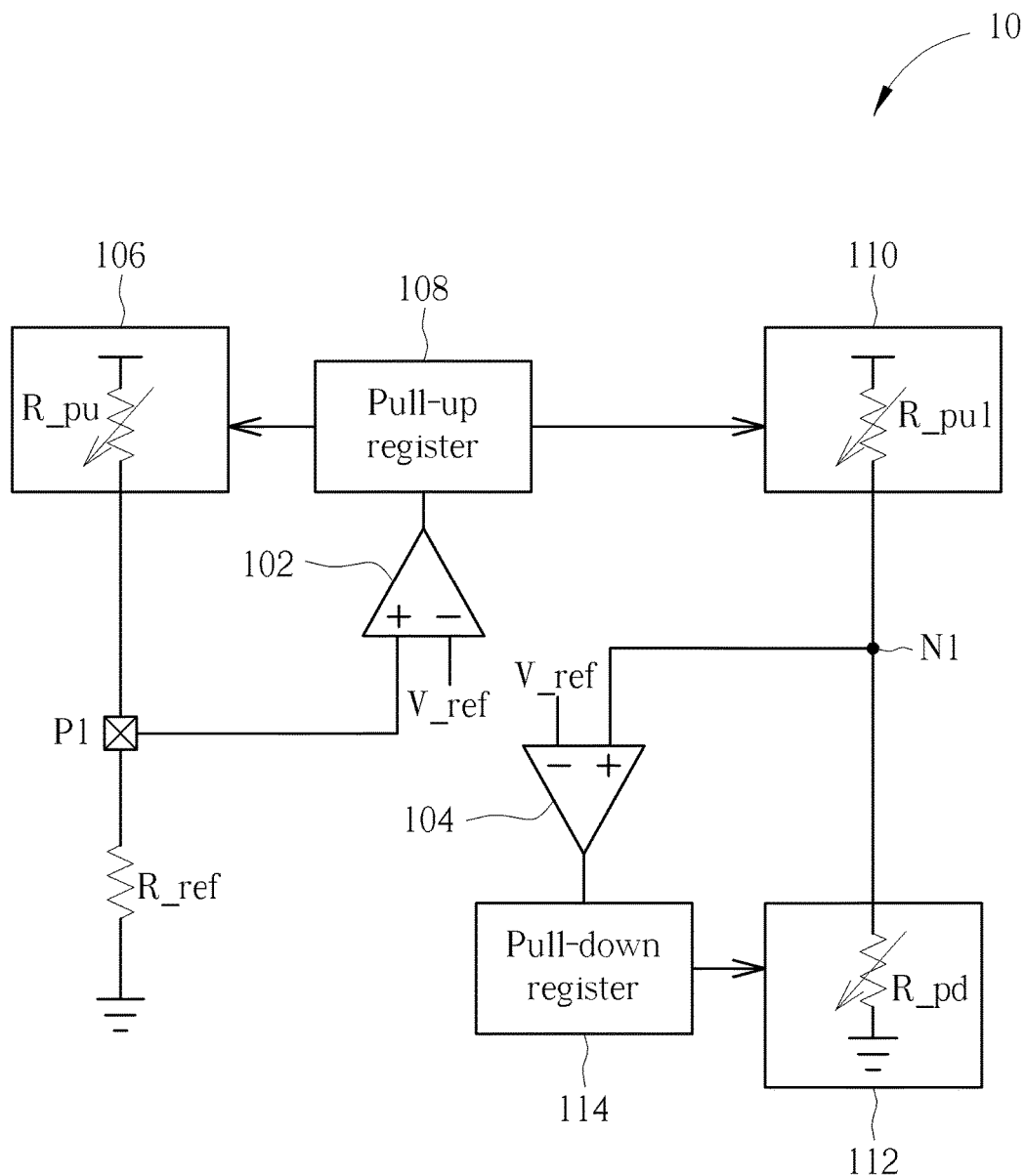
FIG. 1 is a schematic diagram of a general resistor calibration system.

Please refer to FIG. 1, which is a schematic diagram of a general resistor calibration system 10. The resistor calibration system 10 is commonly used for calibrating anon-chip termination (OCT) resistor. As shown in FIG. 1, the resistor calibration system 10 includes a reference resistor R_ref, comparators 102 and 104, a pull-up driver 106, a pull-up register 108, a duplicated pull-up driver 110, a pull-down driver 112 and a pull-down register 114. The reference resistor R_ref is an external reference resistor, and is coupled to a chip via a pad P1 for OCT calibration. The comparators 102 and 104, the pull-up driver 106, the pull-up register 108, the duplicated pull-up driver 110, the pull-down driver 112 and the pull-down register 114 are inside the chip. The external reference resistor R_ref is used for OCT calibration of a pull-up resistor R_pu in the pull-up driver 106 and a pull-down resistor R_pd in the pull-down driver 112.

The circuit structure of the resistor calibration system 10 is used for performing the voltage mode calibration. In detail, the comparator 102 compares the voltage of the pad P1 with a reference voltage V_ref and controls the resistance value of the pull-up resistor R_pu in the pull-up driver 106 to vary via the pull-up register 108. When the voltage of the pad P1 is equal to the reference voltage V_ref, the resistance adjustment is done and the pull-up resistor R_pu reaches a target resistance value. Since the resistance value of the reference resistor R_ref is accurate, the resistance value of the pull-up resistor R_pu may be substantially accurate after calibration.

Subsequently, the calibration scheme calibrates the pull-down resistor R_pd in the pull-down driver 112 based on the resistance setting of the pull-up register 108. The pull-up register 108 controls the duplicated pull-up driver 110 to have the same setting as the pull-up driver 106. In other words, a pull-up resistor R_pu1 in the duplicated pull-up driver 110 may have the same resistance value as the pull-up resistor R_pu in the pull-up driver 106. Since the resistance value of the pull-up resistor R_pu is substantially accurate, the resistance value of the pull-up resistor R_pu1 may be substantially accurate as well. The duplicated pull-up driver 110 is connected to the pull-down driver 112 via a node N1. The comparator 104 compares the voltage of the node N1 with the reference voltage V_ref and controls the resistance value of the pull-down resistor R_pd in the pull-down driver 112 to vary via the pull-down register 114. When the voltage of the node N1 is equal to the reference voltage V_ref, the resistance adjustment is done and the pull-down resistor R_pd reaches a target resistance value. Since the resistance value of the pull-up resistor R_pu1 is substantially accurate, the resistance value of the pull-down resistor R_pd may be substantially accurate after calibration.

However, both of the comparators 102 and 104 may possess an input offset error. In such a situation, the output signal of the comparator 102 or 104 may not change state exactly when the voltage received by the positive input terminal equals the reference voltage V_ref received by the negative input terminal. Therefore, the input offset error at each comparator changes the calibration result at each phase. Note that the magnitudes of input offset error generated by the comparators 102 and 104 may usually be different due to device random mismatch, even when the comparators 102 and 104 have the same circuit structure.

In order to solve the abovementioned problem, the present invention provides another resistor calibration system where a comparator is shared by the calibration process of calibrating the pull-up resistor and the calibration process of calibrating the pull-down resistor. Since the magnitude of the offset error is the same during the calibration processes for the pull-up resistor and the pull-down resistor, it eliminates the influence of the input offset error at each phase and results in an accurate OCT calibration.

Figure 2:
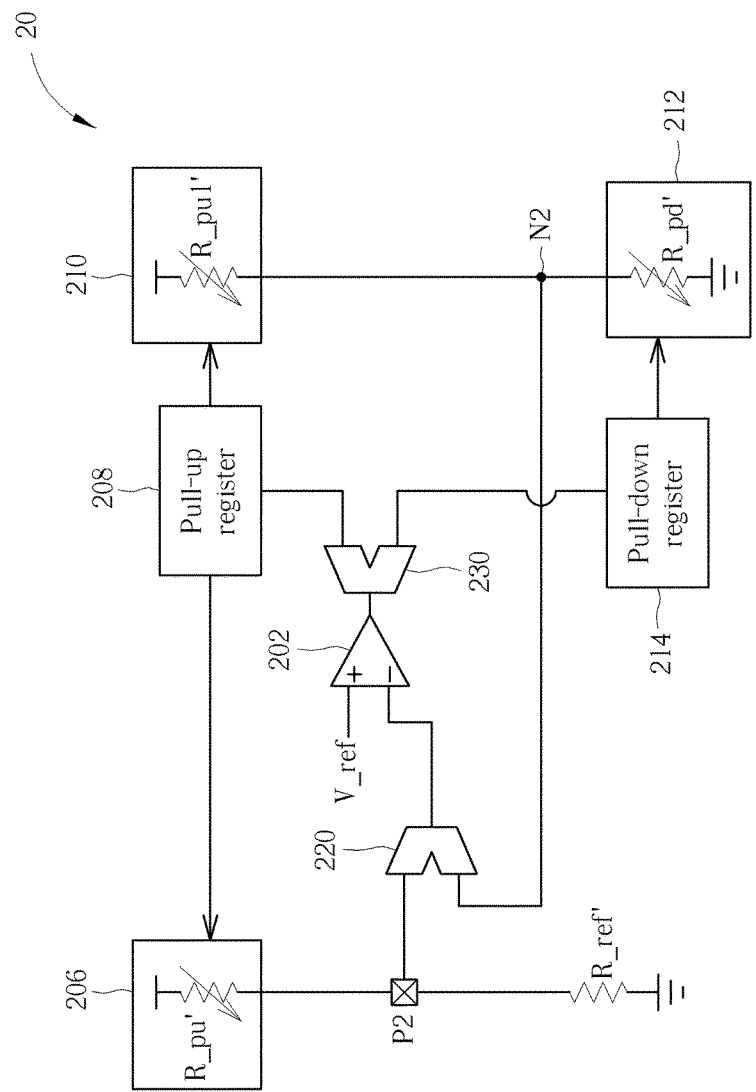
FIG. 2 is a schematic diagram of a resistor calibration system according to an embodiment of the present invention.

Please refer to FIG. 2, which is a schematic diagram of a resistor calibration system 20 according to an embodiment of the present invention. As shown in FIG. 2, the resistor calibration system 20 includes a reference resistor R_ref', a comparator 202, a pull-up driver 206, a pull-up register 208, a duplicated pull-up driver 210, a pull-down driver 212, a pull-down register 214, a multiplexer (MUX) 220 and a de-multiplexer (DEMUX) 230. The reference resistor R_ref' is an external reference resistor, and is coupled to a chip via a pad P2 for OCT calibration. The other components of the resistor calibration system 20 are inside the chip. The external reference resistor R_ref' provides a reference resistance for OCT calibration of a pull-up resistor R_pu' in the pull-up driver 206 and a pull-down resistor R_pd' in the pull-down driver 212.

In detail, the pull-up register 208 calibrates the pull-up resistor R_pu' in the pull-up driver 206, and also calibrates a duplicated pull-up resistor R_pu1' in the duplicated pull-up driver 210. The pull-down register 214 calibrates the pull-down resistor R_pd' in the pull-down driver 212. In order to realize the sharing of the comparator 202, the positive input terminal of the comparator 202 receives the reference voltage V_ref, and the negative input terminal and the output terminal of the comparator 202 are coupled to the output terminal of the MUX 220 and the input terminal of the DEMUX 230, respectively. In addition, the MUX 220 has two input terminals, wherein a first input terminal is coupled to the pull-up driver 206 and the reference resistor R_ref' via the pad P2, and a second input terminal is coupled to the duplicated pull-up driver 210 and the pull-down driver 212 via a node N2. The DEMUX 230 has two output terminals, wherein a first output terminal is coupled to the pull-up register 208, and a second output terminal is coupled to the pull-down register 214.

As can be seen, the comparator 202 may be shared by the calibration process of calibrating the pull-up resistor R_pu' and the calibration process of calibrating the pull-down resistor R_pd' via the implementations of the MUX 220 and the DEMUX 230. More specifically, the resistor calibration system 20 may calibrate the pull-up resistor R_pu' according to the comparison result of the comparator 202 in a first phase, and then calibrate the pull-down resistor R_pd' according to the comparison result of the same comparator 202 in a second phase.

Figure 3:
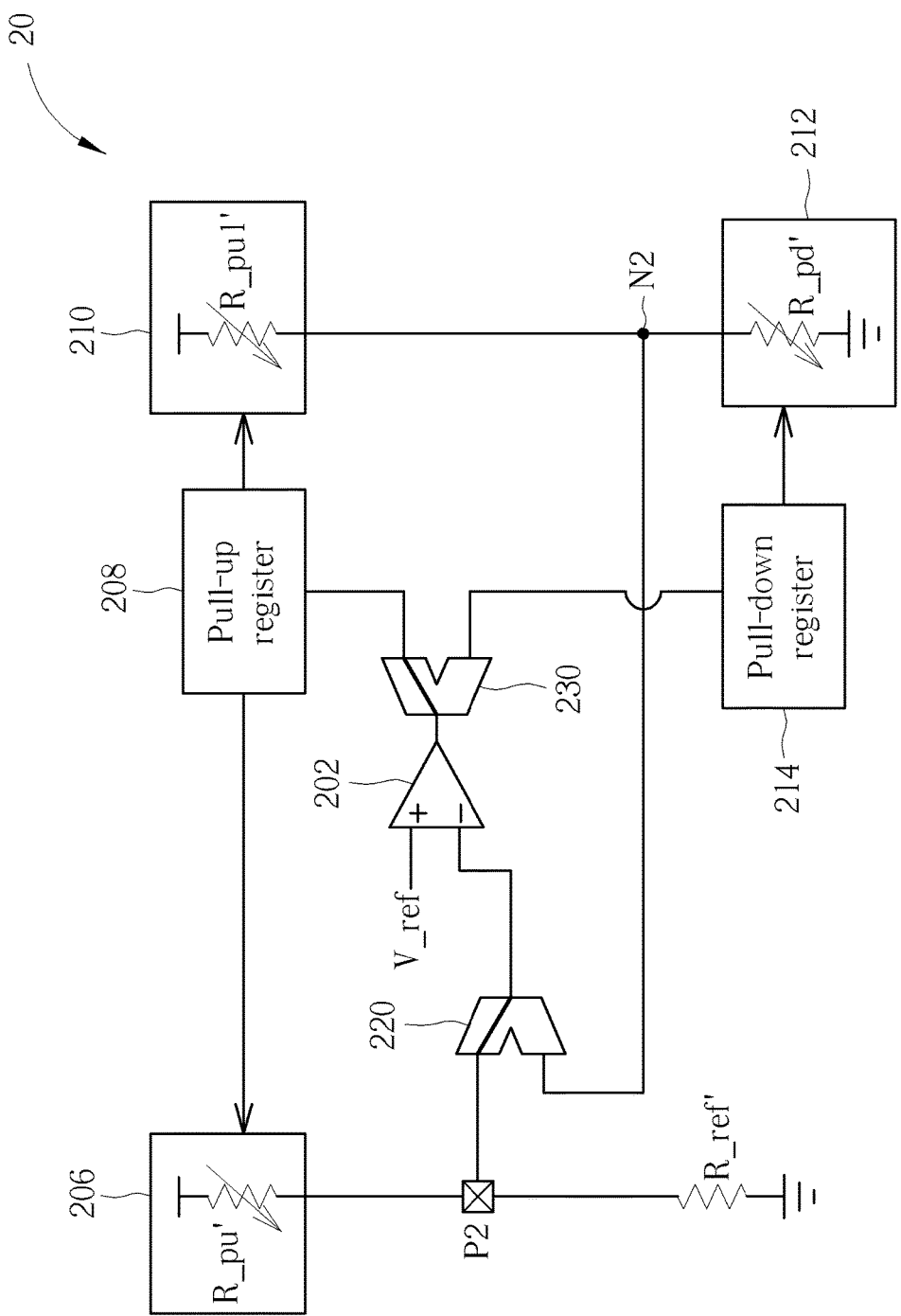
FIG. 3 is a schematic diagram of calibration operation of the resistor calibration system in the first phase.

Please refer to FIG. 3, which is a schematic diagram of calibration operation of the resistor calibration system 20 in the first phase. FIG. 3 illustrates the operation of calibrating the pull-up resistor R_pu' in the pull-up driver 206. In the first phase, the output terminal of the MUX 220 is connected to the first input terminal of the MUX 220, allowing the negative input terminal of the comparator 202 to be coupled to the pad P2, which is further coupled to the reference resistor R_ref' and the pull-up driver 206. The input terminal of the DEMUX 230 is connected to the first output terminal of the DEMUX 230, allowing the output terminal of the comparator 202 to be coupled to the pull-up register 208. Therefore, in the first phase, the comparator 202 controls the pull-up register 208 to calibrate the pull-up resistor R_pu' in the pull-up driver 206 according to the comparison result of the reference voltage V_ref and the voltage on the pad P2. Meanwhile, the comparator 202 controls the pull-up register 208 to calibrate the duplicated pull-up resistor R_pu1' in the duplicated pull-up driver 210 in the same manner; that is, the resistance setting of the pull-up resistor R_pu' is duplicated to the duplicated pull-up resistor R_pu1' in another terminal.

Figure 4:
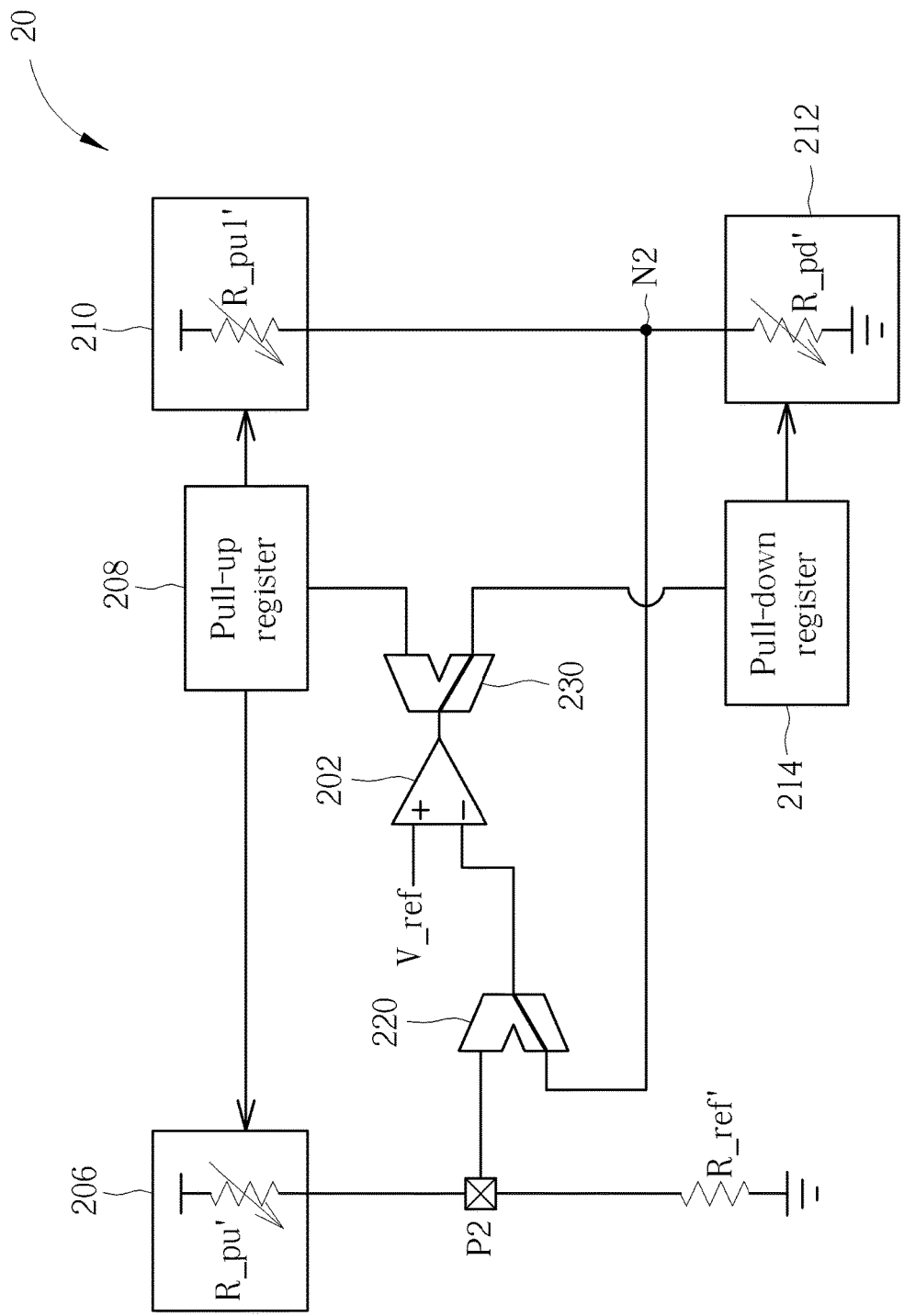
FIG. 4 is a schematic diagram of calibration operation of the resistor calibration system in the second phase.

Please refer to FIG. 4, which is a schematic diagram of calibration operation of the resistor calibration system 20 in the second phase. FIG. 4 illustrates the operation of calibrating the pull-down resistor R_pd' in the pull-down driver 212. In the second phase, the output terminal of the MUX 220 may be connected to the second input terminal of the MUX 220, allowing the negative input terminal of the comparator 202 to be coupled to the node N2 between the duplicated pull-up driver 210 and the pull-down driver 212. The input terminal of the DEMUX 230 may be connected to the second output terminal of the DEMUX 230, allowing the output terminal of the comparator 202 to be coupled to the pull-down register 214. Therefore, in the second phase, the comparator 202 controls the pull-down register 214 to calibrate the pull-down resistor R_pd' in the pull-down driver 212 according to the comparison result of the reference voltage V_ref and the voltage on the node N2. Since the duplicated pull-up resistor R_pu1' is calibrated in the first phase, the calibration operation in the second phase obtains the accurate value of the pull-down resistor R_pd' by using the accurate duplicated pull-up resistor R_pu1'.

Please note that the comparator 202 suffers an input offset error due to device random mismatch between the two input terminals of the comparator 202. Since the offset error generates the same magnitude of error in the first phase and in the second phase, the calibration operation still generates the same calibration result at each phase. In other words, though the offset voltage causes the pull-up resistor R_pu' variation at phase one, the resistance ratio of R_ref' to R_pu' is identical to the ratio of R_pd' to the R_pu1' at phase two because the input offset polarity does not change at these two calibration phases.

In an embodiment, the pull-up resistor R_pu' may be variable and include a resistor ladder or a resistor array in the pull-up driver 206. The pull-up register 208 may store information indicating a selection of the resistance value of the pull-up resistor R_pu' from the resistor ladder or the resistor array. In addition, the pull-up register 208 may act as a control circuit for outputting a signal to select the resistance value of the pull-up resistor R_pu'. For example, when the comparison result of the comparator 202 indicates that the voltage value on the pad P2 is equal to the reference voltage V_ref, the resistance adjustment of the pull-up driver 206 is done and the pull-up resistor R_pu' reaches a target resistance value.

Similarly, the pull-down resistor R_pd' may be variable and include a resistor ladder or a resistor array in the pull-down driver 212. The pull-down register 214 may store information indicating a selection of the resistance value of the pull-down resistor R_pd' from the resistor ladder or the resistor array. In addition, the pull-down register 214 may act as a control circuit for outputting a signal to select the resistance value of the pull-down resistor R_pd'. For example, when the comparison result of the comparator 202 indicates that the voltage value on the node N2 is equal to the reference voltage V_ref, the resistance adjustment of the pull-down driver 212 is done and the pull-down resistor R_pd' reaches a target resistance value.

Please note that the present invention aims at providing a resistor calibration system where the impacts from the comparator input offset error at each calibration phase is cancelled out by sharing the comparator in the two-step calibration operation. Those skilled in the art may make modifications and alternations accordingly. For example, the circuit structure of the resistor calibration system 20 shown in FIG. 2 is only one of various embodiments of the present invention. The calibration operation may be realized by other methods. In an embodiment, the resistor calibration system may calibrate the pull-down resistor in the first phase, and then calibrate the pull-up resistor in the second phase.

Figure 5:
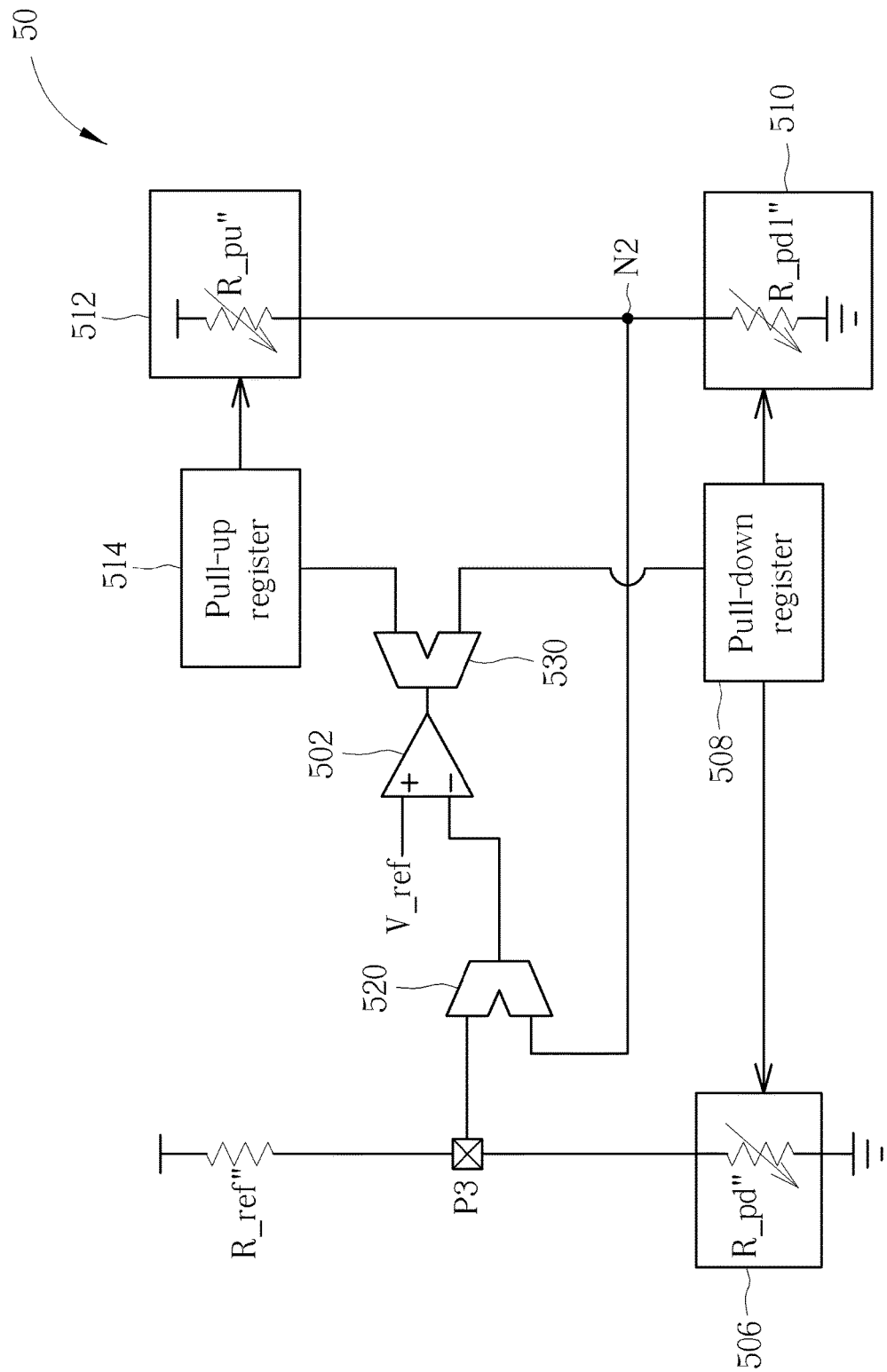
FIG. 5 is a schematic diagram of another resistor calibration system according to an embodiment of the present invention.

Please refer to FIG. 5, which is a schematic diagram of another resistor calibration system 50 according to an embodiment of the present invention. As shown in FIG. 5, the resistor calibration system includes a reference resistor R_ref", a comparator 502, a pull-down driver 506, a pull-down register 508, a duplicated pull-down driver 510, a pull-up driver 512, a pull-up register 514, a MUX 520 and a DEMUX 530. Similarly, the reference resistor R_ref" is an external reference resistor, and is coupled to a chip via a pad P3 for OCT calibration. The other components of the resistor calibration system 50 are inside the chip. The external reference resistor R_ref" provides a reference resistance for OCT calibration of a pull-up resistor R_pu" in the pull-up driver 512 and a pull-down resistor R_pd" in the pull-down driver 506.

As mentioned above, in the resistor calibration system 20, the pull-up driver 206 is calibrated before the pull-down driver 212, and the calibration of the pull-down driver 212 is performed based on the calibration result of the duplicated pull-up driver 210. In contrary, in the resistor calibration system 50, the pull-down driver 506 is calibrated before the pull-up driver 512, and the calibration of the pull-up driver 512 is performed based on the calibration result of the duplicated pull-down driver 510, i.e., the resistance setting of the duplicated pull-down resistor R_pd1". The descriptions of detailed operations of the two-step calibration operation in the resistor calibration system 50 are omitted herein, since those skilled in the art may easily realize the connections of the MUX 520 and the DEMUX 530 and the corresponding calibration operations by referring to the above descriptions related to the resistor calibration system 20.

To sum up, the present invention provides a resistor calibration system capable of calibrating an on-chip termination resistor while eliminating the impacts from the comparator input offset error. The resistor calibration system includes only one comparator, and the comparator is shared by the calibration process of calibrating the pull-up resistor and the calibration process of calibrating the pull-down resistor. Since the magnitude of the offset error is the same during the calibration processes for the pull-up resistor and the pull-down resistor, the influence of the offset error may thereby be eliminated. As a result, an accurate OCT calibration may be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistor calibration system, comprising:
   a reference resistor, for providing a reference resistance;
   a first control circuit, for calibrating a first resistor and a duplicated first resistor;
   a second control circuit, for calibrating a second resistor;
   a comparator, comprising a first input terminal, a second input terminal and an output terminal, wherein the first input terminal of the comparator receives a reference voltage;
   a multiplexer, comprising a first input terminal, a second input terminal and an output terminal, wherein the first input terminal of the multiplexer is coupled to the reference resistor and the first resistor, the second input terminal of the multiplexer is coupled to the duplicated first resistor and the second resistor, and the output terminal of the multiplexer is coupled to the second input terminal of the comparator; and
   a de-multiplexer, comprising an input terminal, a first output terminal and a second output terminal, wherein the input terminal of the de-multiplexer is coupled to the output terminal of the comparator, the first output terminal of the de-multiplexer is coupled to the first control circuit, and the second output terminal of the de-multiplexer is coupled to the second control circuit.

2. The resistor calibration system of claim 1, wherein the first resistor and the duplicated first resistor are pull-up resistors, and the second resistor is a pull-down resistor.

3. The resistor calibration system of claim 1, wherein the first resistor and the duplicated first resistor are pull-down resistors, and the second resistor is a pull-up resistor.

4. The resistor calibration system of claim 1, wherein in a first phase, the output terminal of the multiplexer is connected to the first input terminal of the multiplexer, and the input terminal of the de-multiplexer is connected to the first output terminal of the de-multiplexer.

5. The resistor calibration system of claim 4, wherein in the first phase, the comparator controls the first control circuit to calibrate the first resistor according to the reference resistance of the reference resistor.

6. The resistor calibration system of claim 1, wherein in a second phase, the output terminal of the multiplexer is connected to the second input terminal of the multiplexer, and the input terminal of the de-multiplexer is connected to the second output terminal of the de-multiplexer.

7. The resistor calibration system of claim 6, wherein in the second phase, the comparator controls the second control circuit to calibrate the second resistor according to a resistance of the duplicated first resistor.

8. The resistor calibration system of claim 1, wherein the first control circuit comprises a register, for storing information indicating a selection of a resistance value of the first resistor from a resistor ladder or a resistor array.

9. The resistor calibration system of claim 1, wherein the second control circuit comprises a register, for storing information indicating a selection of a resistance value of the second resistor from a resistor ladder or a resistor array.

10. The resistor calibration system of claim 1, wherein the comparator is shared by a calibration process of calibrating the first resistor and a process of calibrating the second resistor.

* * * * *